(12) United States Patent
Fukuyama

(10) Patent No.: US 8,199,548 B2
(45) Date of Patent: Jun. 12, 2012

(54) SEMICONDUCTOR STORAGE DEVICE

(75) Inventor: Hiroyuki Fukuyama, Yamanashi (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 295 days.

(21) Appl. No.: 12/724,441

(22) Filed: Mar. 16, 2010

(65) Prior Publication Data

US 2010/0238694 A1    Sep. 23, 2010

(30) Foreign Application Priority Data

Mar. 19, 2009  (JP) ................................. 2009-067789

(51) Int. Cl.
*G11C 5/02* (2006.01)
(52) U.S. Cl. ........................................... 365/51; 365/63
(58) Field of Classification Search .................... 365/51, 365/63, 94
See application file for complete search history.

(56) References Cited

U.S. PATENT DOCUMENTS

| | | | | |
|---|---|---|---|---|
| 7,120,843 | B2 * | 10/2006 | Whetsel | 714/726 |
| 2005/0141255 | A1 * | 6/2005 | Ko et al. | 365/51 |
| 2008/0208537 | A1 * | 8/2008 | Lee et al. | 702/186 |
| 2011/0032263 | A1 * | 2/2011 | Ogawa et al. | 345/545 |

FOREIGN PATENT DOCUMENTS

JP   2004-071838   3/2004

* cited by examiner

*Primary Examiner* — Vu Le
(74) *Attorney, Agent, or Firm* — Volentine & Whitt, PLLC

(57) ABSTRACT

A semiconductor storage device is configured to reduce data read time. In the semiconductor storage device, an input/output control circuit is formed along one side of a memory cell array disposed between a data input pad and a data output pad. The input/output control circuit is disposed between a hold command input pad and a clock input pad. Accordingly, it is possible to minimize the distances of the wirings from the input/output control circuit to the pads and to make the distances of the wirings equal and thus to minimize the read time of the memory cell array. In addition, since it is also possible to make equal wiring distances from the input/output control circuit to the address decoder and output multiplexer, it is possible to minimize the read time of the memory cell array.

20 Claims, 6 Drawing Sheets

SEMICONDUCTOR STORAGE DEVICE

BACKGROUND OF THE INVENTION

1. Field of the Invention

The present invention relates to a semiconductor storage device such as a Read Only Memory (ROM) or a flash memory constructed of a semiconductor integrated circuit (for example, a Large Scale Integration (LSI) circuit), and more particularly to disposition of a data read circuit in a serial input/output interface or the like.

2. Description of the Related Art

FIG. 1 is a schematic plan view illustrating a conventional semiconductor storage device.

For example, the serial storage device is constructed of a memory LSI chip such as a flash memory or ROM having a serial input/output interface.

Generally, the semiconductor storage device has a structure such that a memory cell array 2 for data storage occupies most of a chip 1 which is a rectangular substrate as shown in FIG. 1. That is, the memory cell array 2 is disposed at the center of the chip 1 and peripheral circuits for reading data from the memory cell array 2 (for example, an address decoder 3, an output multiplexer 4, input/output control circuits (not shown), etc.) are disposed around the memory cell array 2. In the case of a memory LSI chip, pads for input/output signals are mostly disposed on the chip 1 along two opposing sides of the chip 1. In this case, data input pads 5 for inputting address signals or the like are disposed on the chip 1 along one side (for example, a lower side in the figure) of the chip 1 and data output pads 6 for outputting data signals or the like are disposed along another side (for example, an upper side in the figure) thereof. In addition, a hold command input pad 7 for inputting a hold command is disposed on the chip 1 along the same side as where the data input pads 5 are disposed and a clock input pad 8 for inputting a clock signal or the like is disposed along the same side as where the data output pads 6 are disposed.

In the case where the semiconductor storage device is constructed as described above, the chip size thereof is determined such that the lateral length of the chip 1 is determined based on the memory cell array 2 that occupies most of the chip 1 and the longitudinal length is determined after peripheral circuits or the like are disposed as closely as possible along the lateral sides of the chip 1.

For example, Japanese Patent Kokai No. 2004-71838 describes a technology in connection with the semiconductor storage device of FIG. 1 in which address terminals are disposed on a chip along one side of the chip and data terminals are disposed along the opposite side.

However, the conventional semiconductor storage device has the following problems.

In the conventional semiconductor storage device shown in FIG. 1, the data input pads 5, the data output pads 6, and the like are disposed on the chip 1 along the two sides of the memory cell array 2. The semiconductor storage device cannot achieve required memory read performance when respective distances (i.e., lengths) of wirings between the input/output control circuit (not shown) and the data input and output pads 5 and 6 are different since memory read time is determined based on the wiring distances (i.e., based on signal delay times due to resistances of the wirings).

SUMMARY OF THE INVENTION

It is an object of the present invention to provide a semiconductor storage device that solves the above problems.

The semiconductor storage device according to the present invention includes a substrate having a first side and a second side facing each other, at least one input pad disposed on the substrate along the first side, at least one output pad disposed on the substrate along the second side, a memory cell array for data storage disposed between the input and output pads, the memory cell array having a third side and a fourth side opposing to each other and extending perpendicular to the first and second sides, and an input/output control circuit.

The input/output control circuit is disposed along one of the third fourth sides of the memory cell array, is connected to the input pad through a first wiring, and is connected to the output pad through a second wiring, and controls input/output of data from/to the memory cell array through the first and second wirings.

According to the present invention, since the input/output control circuit is disposed along the third or fourth side of the memory cell array disposed between the input and output pads, it is possible to minimize the lengths of wirings from the input/output control circuit to the pads or the like and thus to minimize read time of the memory cell array.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Modes for carrying out the present invention will be apparent from the following description of preferred embodiments with reference to the accompanying drawings. The description and the drawings are merely illustrative and should not be construed as limiting the scope of the present invention.

Embodiment 1

Configuration of Embodiment 1

Figure 1:
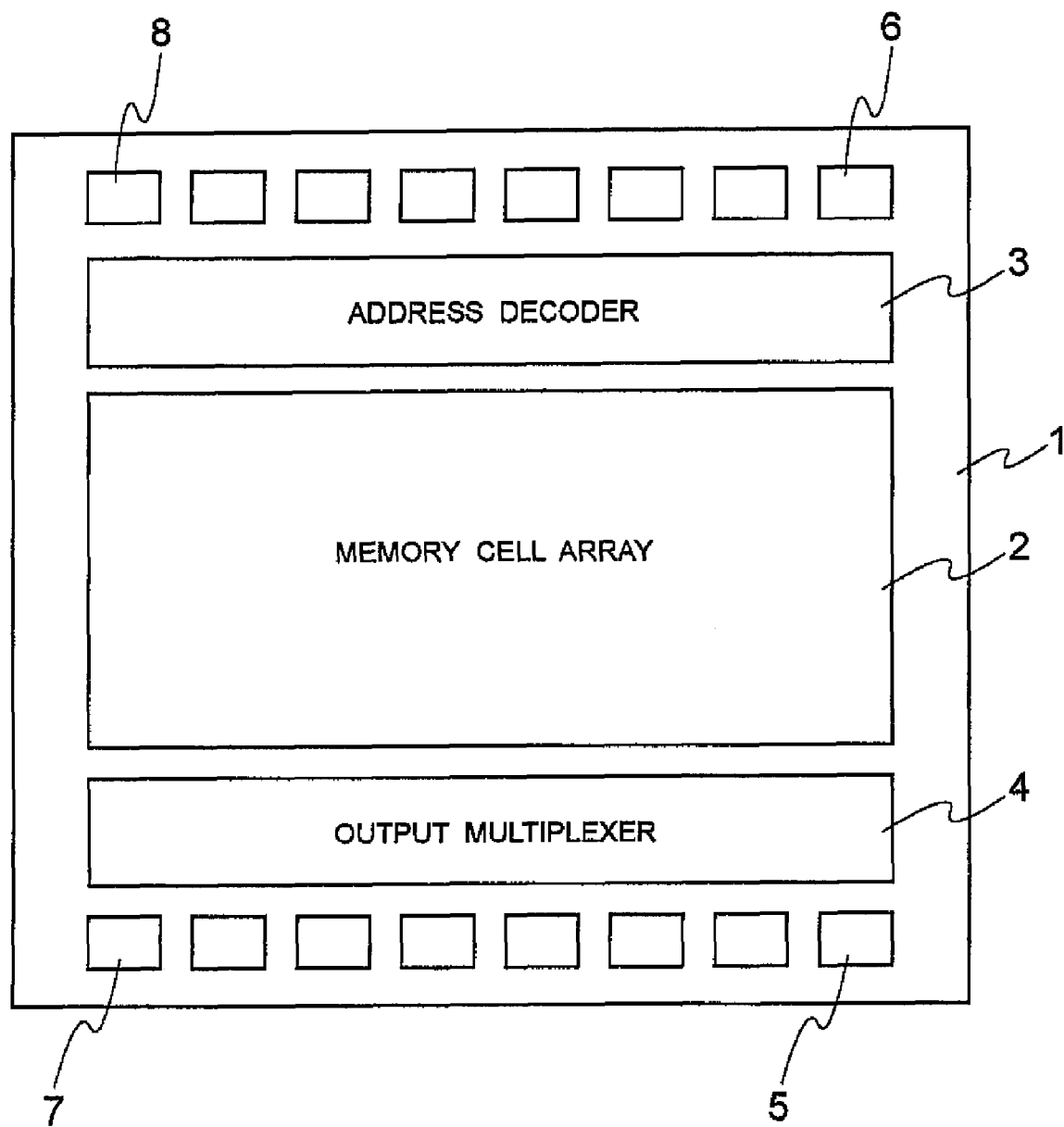
FIG. 1 is a schematic plan view illustrating a conventional semiconductor storage device.
Figure 2:
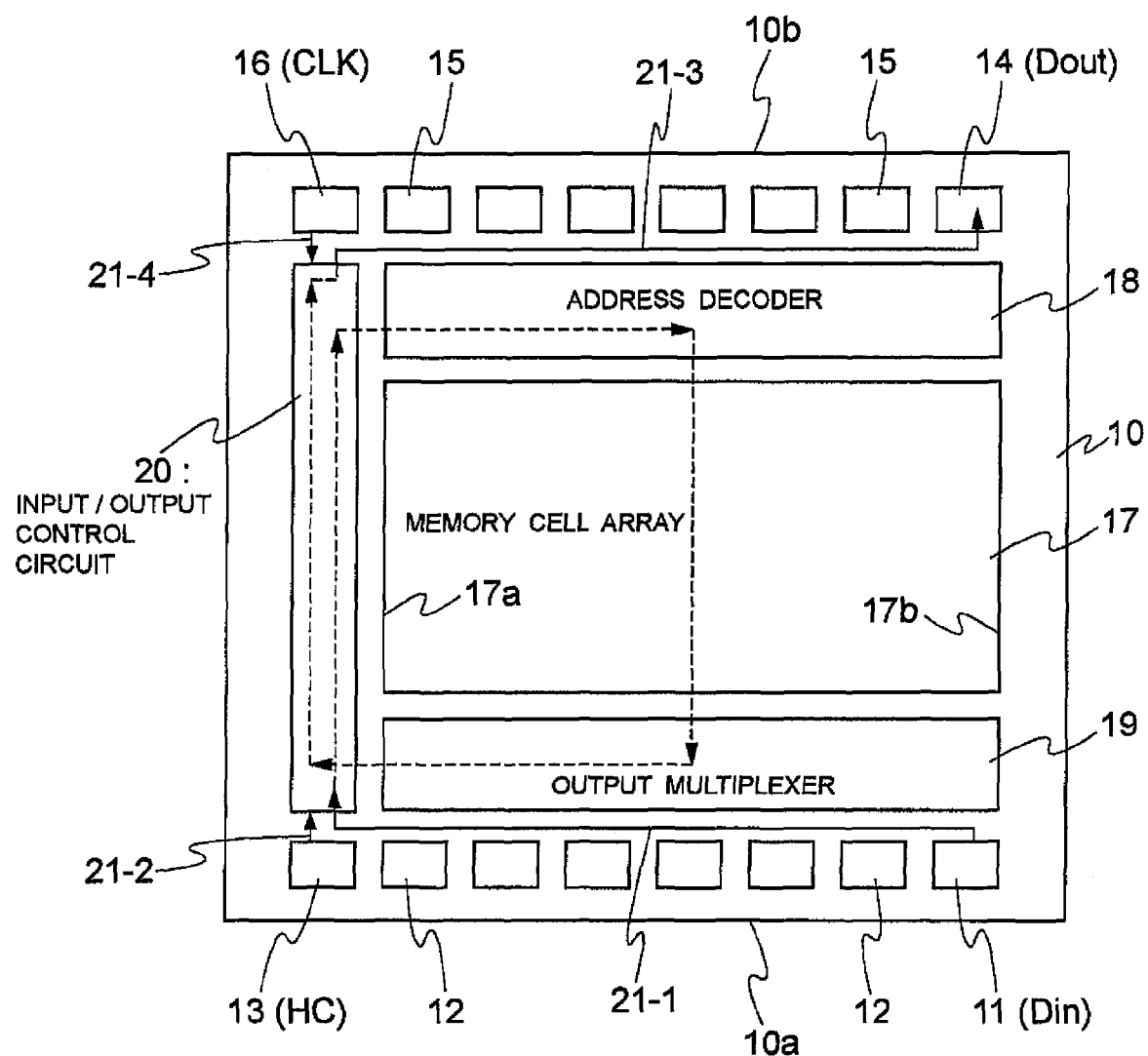
FIG. 2 is a schematic plan view illustrating a semiconductor storage device according to Embodiment 1 of the present invention.

FIG. 2 is a schematic plan view illustrating a semiconductor storage device according to Embodiment 1 of the present invention.

For example, the semiconductor storage device includes a memory LSI chip such as a flash memory or a ROM having a serial input/output interface.

The semiconductor storage device includes a chip 10 which is a rectangular substrate. The chip 10 has a first side 10a and a second side 10b opposing to each other. An input pad 11 (for example, a data input pad for inputting serial data Din of a command or address), a plurality of reserved pads 12, and a control input pad 13 for inputting a control signal (for example, a hold command input pad for inputting a hold command HC which is a control signal) are formed on the chip 10 along the first side 10*a*. An output pad 14 (for example, a data output pad for outputting serial data Dout), a plurality of reserved pads 15, and a clock input pad 16 for inputting a clock signal (which will hereinafter be referred to as a "clock" for short) CLK are formed on the chip 10 along the second side 10*b*.

A memory cell array 17 for data storage is formed between the data input, reserved, and hold command input pads 11, 12, and 13 and the data output, reserved, and clock input pads 14, 15, and 16. The memory cell array 17 includes a plurality of memory cells arranged in a matrix. The memory cell array 17 has a third side 17*a* and a fourth side 17*b* that are opposed to each other and extend perpendicular to the first and second sides 10*a* and 10*b* of the chip 10, and is disposed at a position that deviates from the center of the chip 10 in a direction along the first and second sides 10*a* and 10*b* (for example, disposed at a position on the right side of the center thereof in FIG. 2.

An address decoder 18 is formed between the data output and reserved pads 14 and 15 and the memory cell array 17, and an output multiplexer 19 is also formed between the data input and reserved pads 11 and 12 and the memory cell array 17. The address decoder 18 is a circuit that decodes an input address and selects a corresponding memory cell. The output multiplexer 19 is a circuit that selects parallel data read from the memory cell array 17. Similar to the memory cell array 17, the address decoder 18 and the output multiplexer 19 are disposed at positions that deviate from the center of the chip 10 (for example, disposed on the right side of the center thereof in FIG. 2).

The hold command input pad 13 and the clock input pad 16 are arranged opposite each other. An input/output control circuit 20 is also formed at a position between the hold command input pad 13 and the clock input pad 16 at the third side 17*a* of the memory cell array 17. The input/output control circuit 20 is a circuit that controls serial input and output of data to and from the memory cell array 17 and is constructed, for example, using a gate array. The gate array is an array of basic logic circuits which are previously arranged as logic gates (as a set of logic circuits) on the chip and which allow construction of various circuits simply by designing wirings between the gates according to usage.

The input/output control circuit 20 is connected to the data input pad 11 through a first wiring 21-1, connected to the hold command input pad 13 through a wiring 21-2, connected to the data output pad 14 through a second wiring 21-3, and connected to the clock input pad 16 through a wiring 21-4. The input/output control circuit 20 is also connected to the memory cell array 17, the address decoder 18, and the output multiplexer 19 through wirings that are not shown.

Figure 3:
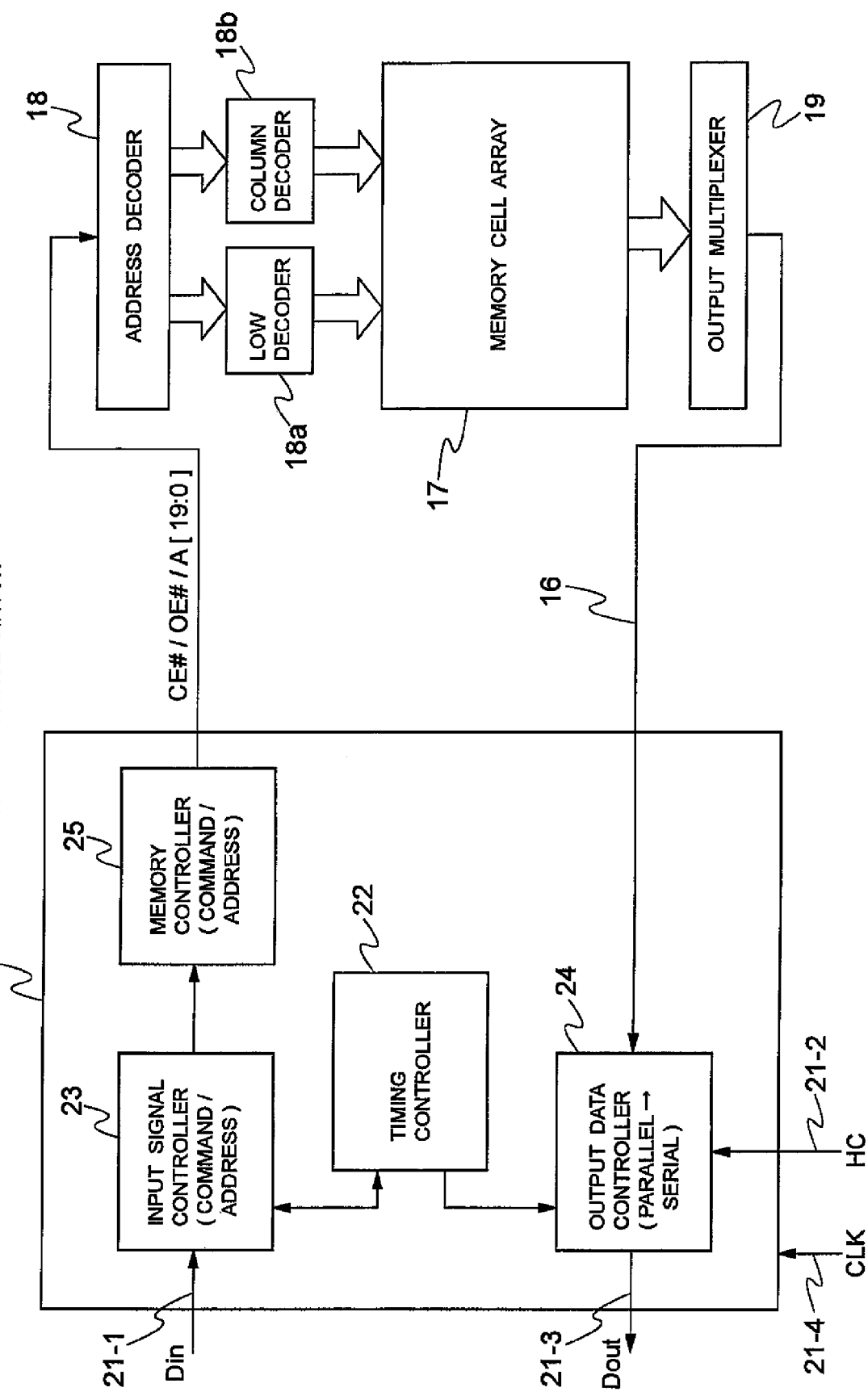
FIG. 3 illustrates a schematic circuit configuration of the semiconductor storage device of FIG. 2.

FIG. 3 is a diagram illustrating a schematic circuit configuration of the semiconductor storage device of FIG. 2.

Although not shown in FIG. 2, a row decoder 18*a* and a column decoder 18*b* are connected between the address decoder 18 and the memory cell array 17. The row decoder 18*a* is a circuit that selects a row of memory cells of the memory cell array 17 based on the decoded result of the address decoder 18. The column decoder 18*b* is a circuit that selects a column of memory cells of the memory cell array 17 based on the decoded result of the address decoder 18.

The input/output control circuit 20 includes a timing controller 22 that controls serial input and output timing and that is connected to an input signal controller 23 and an output data controller 24. The input signal controller 23 is controlled by the timing controller 22 and functions to control the input of serial data Din of address and command. The output data controller 24 is controlled by the timing controller 22 and functions to convert parallel data selected by the output multiplexer 19 into serial data Dout.

The output of the input signal controller 23 is connected to a memory controller 25. The memory controller 25 functions to output a chip enable signal CE#, an output enable signal OE#, and an address A[19:0], which are used to control the memory cell array 17, to the address decoder 18 based on an output signal of the input signal controller 23.

(Operation of Embodiment 1)

The following is a description of a data read operation (1) and a hold command related operation (2) of the semiconductor storage device shown in FIGS. 2 and 3.

(1) Data Read Operation

Figure 4:
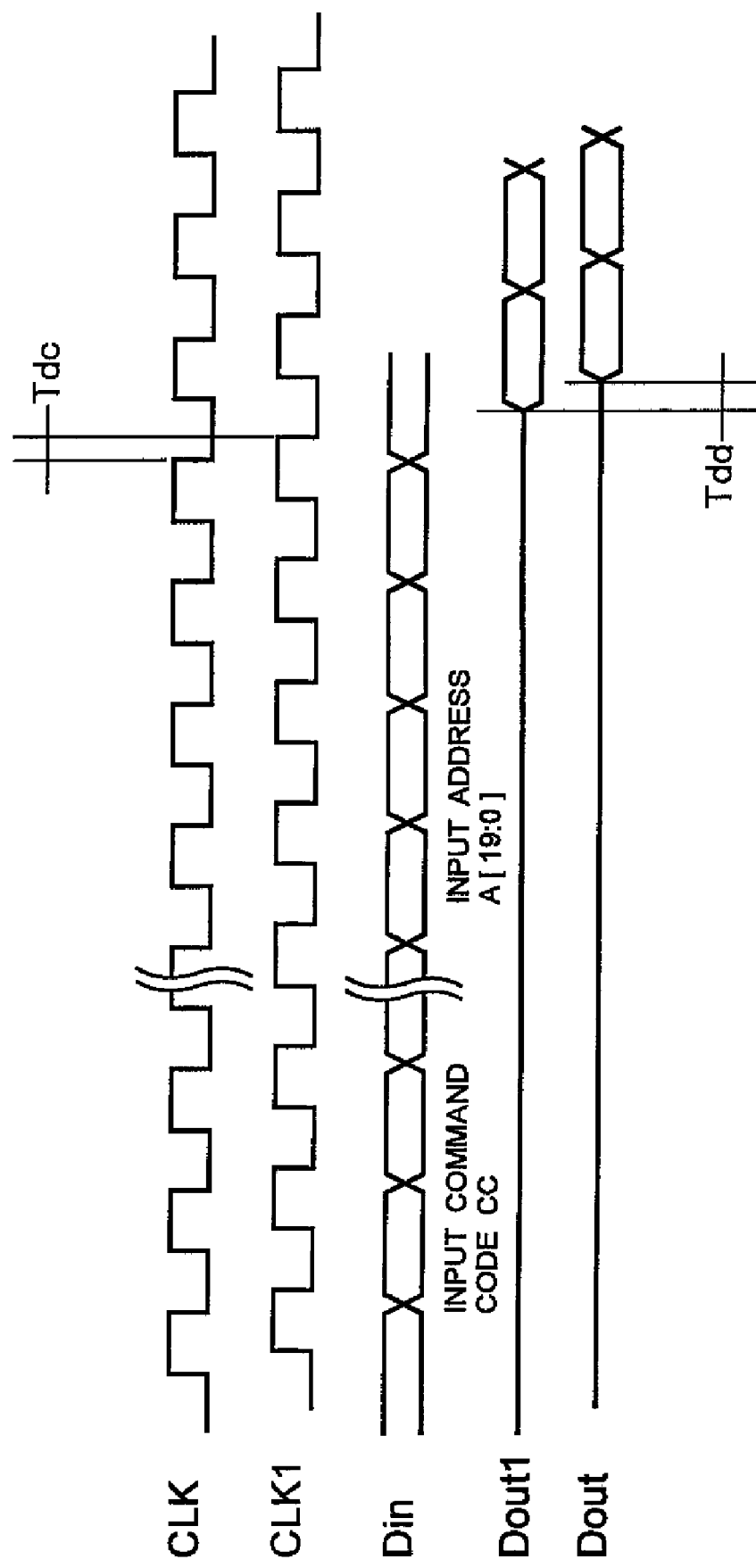
FIG. 4 is a timing chart illustrating a data read operation of the semiconductor storage device shown in FIGS. 2 and 3.

FIG. 4 is a timing chart illustrating a data read operation of the semiconductor storage device shown in FIGS. 2 and 3.

When a clock CLK is input to the clock input pad 16, the clock CLK is delayed by a delay time Tdc through the wiring 21-4 and the delayed clock CLK1 is input to the input/output control circuit 20. In addition, for example, when a 1-byte command code and a 3-byte address A[19:0] are sequentially input as serial data Din to the data input pad 11, the input 4-byte data is transmitted to the input/output control circuit 20 through the wiring 21-1.

In the input/output control circuit 20, the input signal controller 23 sequentially reads the 1-byte command code CC and the 3-byte address A[19:0] at rising edges of the clock CLK1 under control of the timing controller 22 and transmits the read command code CC and address A[19:0] to the memory controller 25. Based on the command code CC among the received command code CC and address A[19:0], the memory controller 25 outputs a chip enable signal CE# and an output enable signal OE# to the address decoder 18 and outputs the address A[19:0] to the address decoder 18.

The address decoder 18 decodes the address A[19:0] and provides the decoded result to the row decoder 18*a* and the column decoder 18*b*. The row decoder 18*a* selects a row of memory cells of the memory cell array 17 based on the decoded result and the column decoder 18*b* selects a column of memory cells of the memory cell array 17 based on the decoded result. Accordingly, 16-bit parallel data is read from a memory cell corresponding to the address A[19:0]. The output multiplexer 19 selects and outputs the 16-bit parallel read data to the output data controller 24.

The output data controller 24 converts the 16-bit parallel read data into serial data Din1 and outputs the converted serial data Din1 between a rising edge of the clock CLK1 to a falling edge of a next clock CLK1. The output serial data Din1 is delayed by a delay time Tdd through the second wiring 21-3 and the delayed serial data Din is output through the data output pad 14.

(2) Hold Command Related Operation

Figure 5:
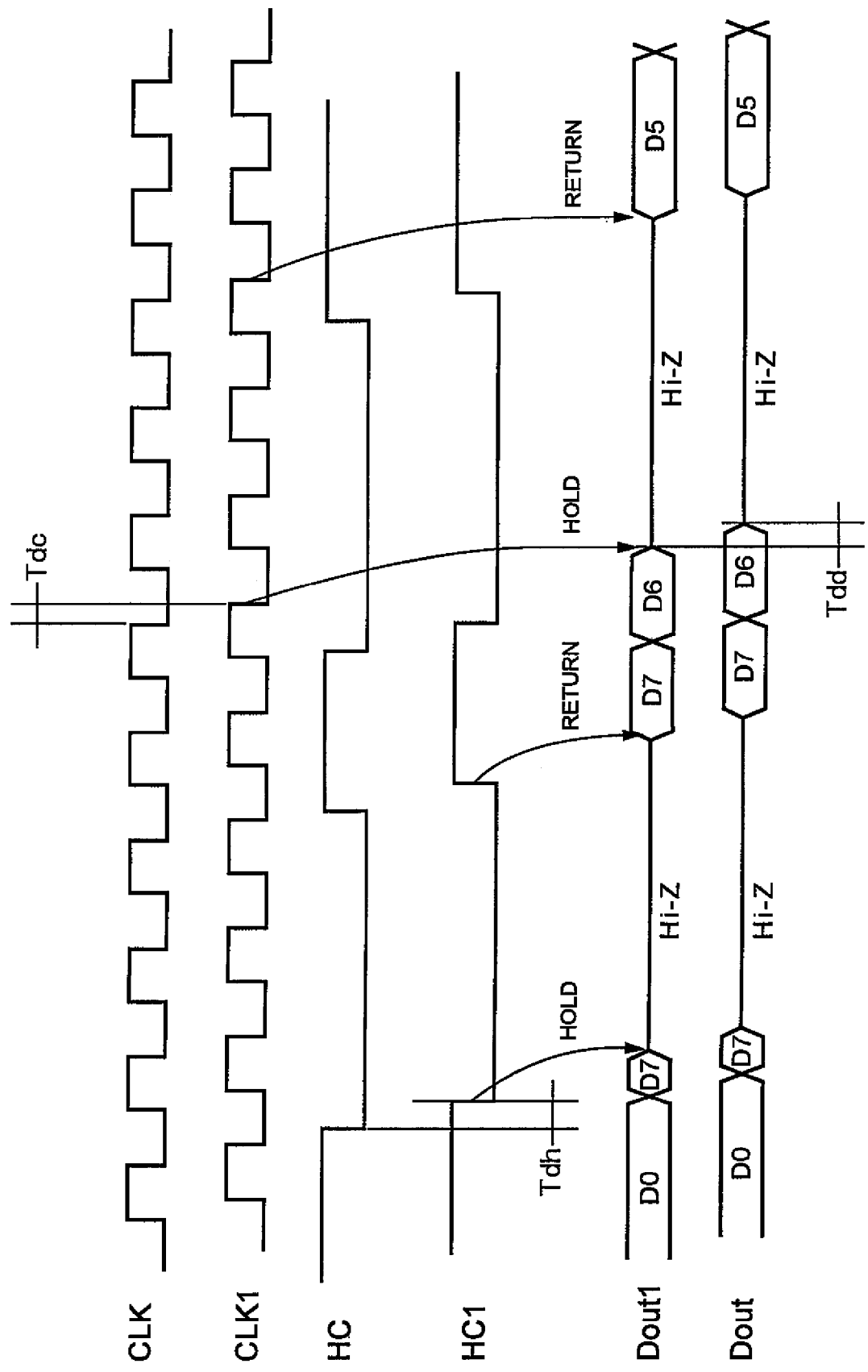
FIG. 5 is a timing chart illustrating a hold command related operation of the semiconductor storage device shown in FIGS. 2 and 3.

FIG. 5 is a timing chart illustrating a hold command related operation of the semiconductor storage device shown in FIGS. 2 and 3.

For example, when an active-low hold command HC is input through the hold command input pad 13, the input hold command HC is delayed by a delay time Tdh through the wiring 21-2 and the delayed hold command HC1 is input to the output data controller 24 in the input/output control circuit 20. The output data controller 24 converts 16-bit parallel read data transmitted from the output multiplexer 19 into serial data Din1. The serial data Din1 output from the output data controller 24 has high impedance. The clock CLK1 input through the clock input pad 16 and delayed by the delay time Tdc through the wiring 21-4 is disabled.

The read performance of the semiconductor storage device is associated with addition of the delay times Tdc and Tdd to the processing time of the input/output control circuit 20. The processing performance of the hold command HC is associated with addition of the delay times Tdc and Tdd to the processing time of the input/output control circuit 20 when the hold command HC has been issued while the clock CLK is in a state of logic "L". The processing performance of the hold command HC is associated with addition of the delay times Tdc and Tdd to the processing time of the input/output control circuit 20 when the hold command HC has been issued while the clock CLK is in a state of logic "L".

(Advantages of Embodiment 1)

Embodiment 1 has the following advantages (a) to (c).

(a) Since the input/output control circuit 20 is disposed between the hold command input pad 13 and the clock input pad 16, it is possible to minimize the distances (i.e., lengths) of the wirings 21-2 and 21-4 from the input/output control circuit 20 to the hold command input pad 13 and the clock input pad 16 and to make the distances of the wirings 21-2 and 21-4 equal and thus to minimize the read time of the memory cell array 17.

(b) Since it is also possible to make equal wiring distances from the input/output control circuit 20 to the address decoder 18 and the output multiplexer 19, which are respectively located above and below the memory cell array 17 (when viewing the plan view), it is possible to minimize the read time of the memory cell array 17.

(c) It is possible to manufacture a general parallel input/output LSI chip by designing the input/output control circuit 20 so as to enable parallel input/output control while using the data input pad 11 and the reserved pads 12 as input pads of parallel data and using the data output pad 14 and the reserved pads 15 as output pads of parallel data. Accordingly, it is possible to realize a memory chip corresponding to both a general parallel input/output memory LSI and a serial input/output memory LSI.

Embodiment 2

Configuration of Embodiment 2

Figure 6:
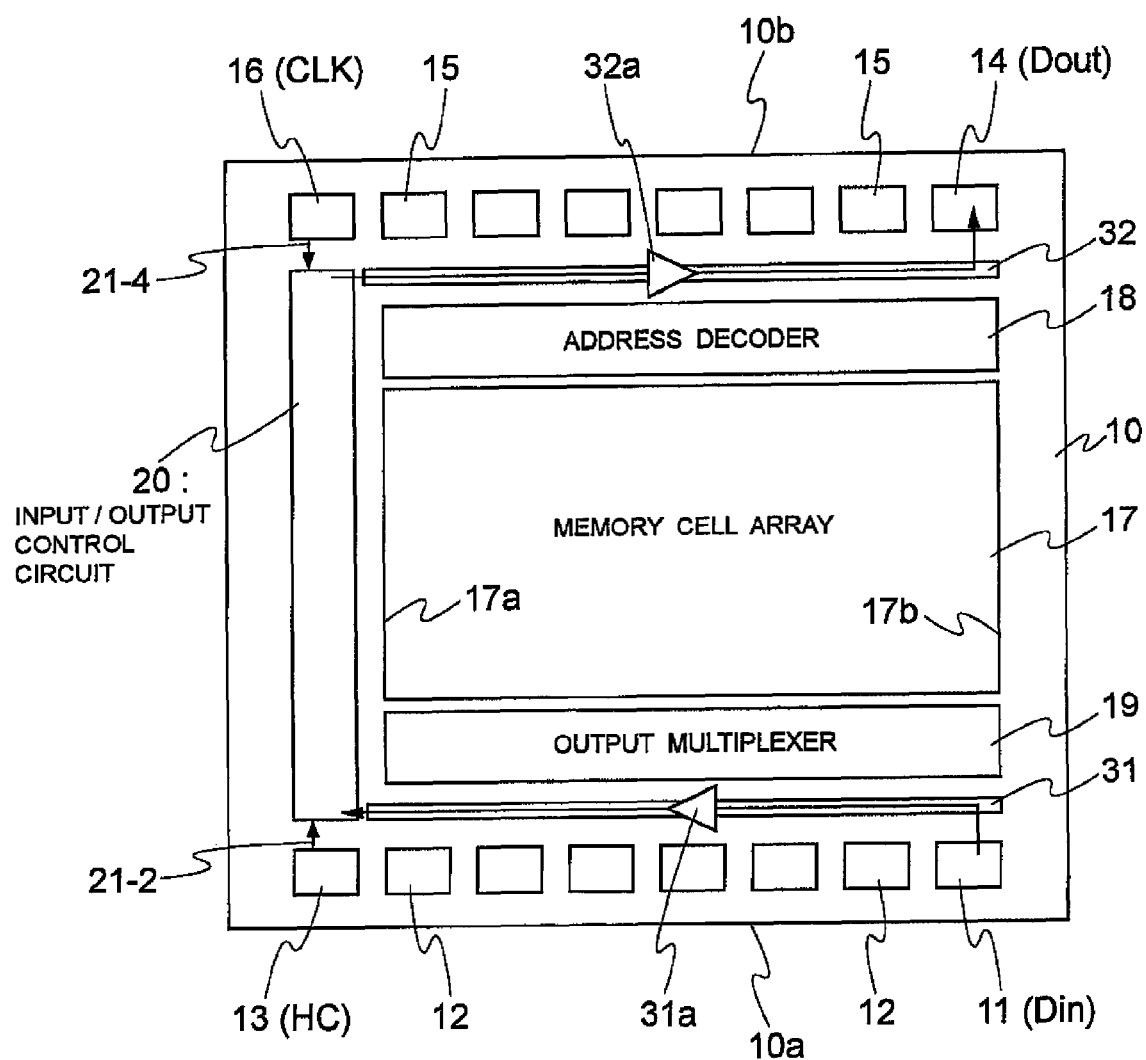
FIG. 6 is a schematic plan view illustrating a semiconductor storage device according to Embodiment 2 of the present invention.

FIG. 6 is a schematic plan view illustrating a semiconductor storage device according to Embodiment 2 of the present invention. Elements in common with those shown in FIG. 2 illustrating Embodiment 1 are denoted by common reference numerals.

The semiconductor storage device of Embodiment 2 includes gate arrays 31 and 32 instead of the first and second wirings 21-1 and 21-3 of Embodiment 1. The gate array 31 is disposed between the output multiplexer 19 and the data input, reserved, and hold command input pads 11, 12, and 13 and a buffer 31a for signal driving is formed using the gate array 31. The buffer 31a is a circuit that drives data Din input through the data input pad 11 and outputs the data Din to the input/output control circuit 20.

The other gate array 32 is disposed between the address decoder 18 and the data output, reserved, and hold command output pads 14, 15, and 16 and a buffer 32a for signal driving is formed using the gate array 32. The buffer 32a is a circuit that drives data output from the input/output control circuit 20 and outputs the driven data Dout to the data output pad 14. Other configurations are similar to Embodiment 1.

(Operation of Embodiment 2)

For example, in the data read operation, when the serial data Din is input to the data input pad 11, the input data Din is driven by the buffer 31a and is then transmitted to the input/output control circuit 20. Then, a chip enable signal CE#, an output enable signal OE#, and an address A[19:0] are output from the input/output control circuit 20. This address A[19:0] is decoded by the address decoder 18, the row decoder 18a, and the column decoder 18b and a memory cell in the memory cell array 17 is selected according to the decoded result.

Parallel data is read from the selected memory cell. The output multiplexer 19 selects and outputs the parallel read data to the input/output control circuit 20. The parallel read data is converted into serial data Din1 through the input/output control circuit 20. The converted serial data is driven by the buffer 32a and the driven serial data Dout is output through the data output pad 14.

(Advantages of Embodiment 2)

Embodiment 2 has the same advantages as those of Embodiment 1. In addition, Embodiment 2 can further improve performance over Embodiment 1 since signals input and output through the data input pad 11 and the data output pad 14, which are located distantly from the input/output control circuit 20, are driven by the buffers 31a and 32a.

(Modifications)

The present invention is not limited to the above Embodiments 1 and 2 and a variety of usages or modifications are possible. For example, the following modifications (a) to (c) are possible.

(a) In Embodiments 1 and 2, the clock input pad 16 and the hold command input pad 13 are disposed on the left side of the chip 10 and the input/output control circuit 20 is disposed on the left side of the memory cell array 17 (when viewing the plan view). However, in the case where the pads 16 and 13 are disposed on the right side of the chip 10, the input/output control circuit 20 may be disposed on the right side of the chip 10 (when viewing the plan view).

(b) Although Embodiments 1 and 2 have been described with reference to an example in which circuits are formed using gate arrays, the input/output control circuit 20 or the buffers 31a and 32a may also be formed without using gate arrays.

(c) Although Embodiments 1 and 2 have been described with reference to serial interface operations, other operations such as parallel interface operations may also be performed by changing the input/output control circuit 20 or the like to other circuit configurations that are not shown.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

This application is based on Japanese Patent Application No. 2009-067789 which is herein incorporated by reference.

What is claimed is:

1. A semiconductor storage device comprising:
   a substrate having a first side and a second side facing each other;
   at least one input pad disposed on the substrate along the first side;
   at least one output pad disposed on the substrate along the second side;
   a memory cell array for data storage disposed between the input and output pads, the memory cell array having a third side and a fourth side facing each other and extending perpendicular to the first and second sides; and
   an input/output control circuit disposed to one of the third and fourth sides of the memory cell array, connected to the input pad through a first wiring, and connected to the output pad through a second wiring, the input/output control circuit controlling input/output of data from/to the memory cell array through the first and second wirings.

2. The semiconductor storage device according to claim 1, wherein the memory cell array is disposed at a position that deviates from a center of the substrate along the first and second sides, and the input/output control circuit is disposed opposite the deviated position at which the memory cell array is disposed.

3. The semiconductor storage device according to claim 1, further comprising:

an address decoder disposed between the output pad and the memory cell array, the address decoder decoding an address input via the input pad, the first wiring, and the input/output control circuit and selecting a memory cell in the memory cell array; and an output multiplexer disposed between the output pad and the memory cell array, the output multiplexer selecting data read from the memory cell array and outputting the selected data through the output pad by way of the input/output control circuit and the second wiring.

4. The semiconductor storage device according to claim 1, further comprising:

a control input pad for inputting a control signal to the input/output control circuit, the control input pad being disposed at the first side and connected to the input/output control circuit through a wiring; and a clock input pad for inputting a clock signal to the input/output control circuit, the clock input pad being disposed at the second side at a position opposite the control input pad and connected to the input/output control circuit through a wiring, wherein the input/output control circuit is disposed at a position between the control input pad and the clock input pad.

5. The semiconductor storage device according to claim 1, further comprising:

a first buffer for signal driving disposed on the first wiring; and a second buffer for signal driving disposed on the second wiring.

6. The semiconductor storage device according to claim 2, further comprising:

a first buffer for signal driving disposed on the first wiring; and a second buffer for signal driving disposed on the second wiring.

7. The semiconductor storage device according to claim 3, further comprising:

a first buffer for signal driving disposed on the first wiring; and a second buffer for signal driving disposed on the second wiring.

8. The semiconductor storage device according to claim 4, further comprising:

a first buffer for signal driving disposed on the first wiring; and a second buffer for signal driving disposed on the second wiring.

9. The semiconductor storage device according to claim 1, wherein the input/output control circuit is constructed using a gate array.

10. The semiconductor storage device according to claim 2, wherein the input/output control circuit is constructed using a gate array.

11. The semiconductor storage device according to claim 3, wherein the input/output control circuit is constructed using a gate array.

12. The semiconductor storage device according to claim 4, wherein the input/output control circuit is constructed using a gate array.

13. The semiconductor storage device according to claim 5, wherein the input/output control circuit is constructed using a gate array.

14. The semiconductor storage device according to claim 6, wherein the input/output control circuit is constructed using a gate array.

15. The semiconductor storage device according to claim 7, wherein the input/output control circuit is constructed using a gate array.

16. The semiconductor storage device according to claim 8, wherein the input/output control circuit is constructed using a gate array.

17. The semiconductor storage device according to claim 5, wherein the first and second buffers are constructed using a gate array.

18. The semiconductor storage device according to claim 6, wherein the first and second buffers are constructed using a gate array.

19. The semiconductor storage device according to claim 7, wherein the first and second buffers are constructed using a gate array.

20. The semiconductor storage device according to claim 8, wherein the first and second buffers are constructed using a gate array.

* * * * *